United States Patent [19]

Wolski et al.

[11] Patent Number: 5,215,646
[45] Date of Patent: Jun. 1, 1993

[54] LOW PROFILE COPPER FOIL AND PROCESS AND APPARATUS FOR MAKING BONDABLE METAL FOILS

[75] Inventors: Adam M. Wolski, Edgewater Park; Kurt Acx, Hopewell, both of N.J.; Michel Mathieu, Bensalem, Pa.; Laure M. Maquet, Ettelbruck, Luxembourg

[73] Assignee: Circuit Foil USA, Inc., Bordentown, N.J.

[21] Appl. No.: 878,973

[22] Filed: May 6, 1992

[51] Int. Cl.[5] .................... C25D 1/04; C25D 17/00
[52] U.S. Cl. ........................................ 205/77; 204/208
[58] Field of Search ........................ 205/77; 204/208

[56] References Cited

U.S. PATENT DOCUMENTS

| | | | |
|---|---|---|---|
| 3,625,844 | 12/1971 | McKean | 204/140 |
| 3,674,656 | 7/1972 | Yates | 204/13 |
| 3,853,716 | 12/1974 | Yates et al. | 204/28 |
| 3,857,681 | 12/1974 | Yates et al. | 204/37 |
| 4,572,768 | 2/1986 | Wolski et al. | 204/13 |

FOREIGN PATENT DOCUMENTS

WO87/03915 7/1987 World Int. Prop. O.

*Primary Examiner*—T. M. Tufariello
*Attorney, Agent, or Firm*—Finnegan, Henderson, Farabow, Garrett and Dunner

[57] ABSTRACT

A one-step electrolytic process and apparatus for producing metal foil, e.g., copper foil having a low profile treated surface for use in fabricating printed circuit boards, wherein primary foil is electrodeposited on a cathode in a first electrodeposition zone using a first current density while circulating electrolyte therein under turbulent flow conditions, and micronodules of the metal are electrodeposited on a matte surface of the primary foil in a second electrodeposition zone using a second current density greater than the first current density while circulating electrolyte therein under laminar flow conditions. A grain refining agent is employed in the electrolyte to further improve the quality. The process provides a low profile finished foil having a high peel strength.

12 Claims, 8 Drawing Sheets

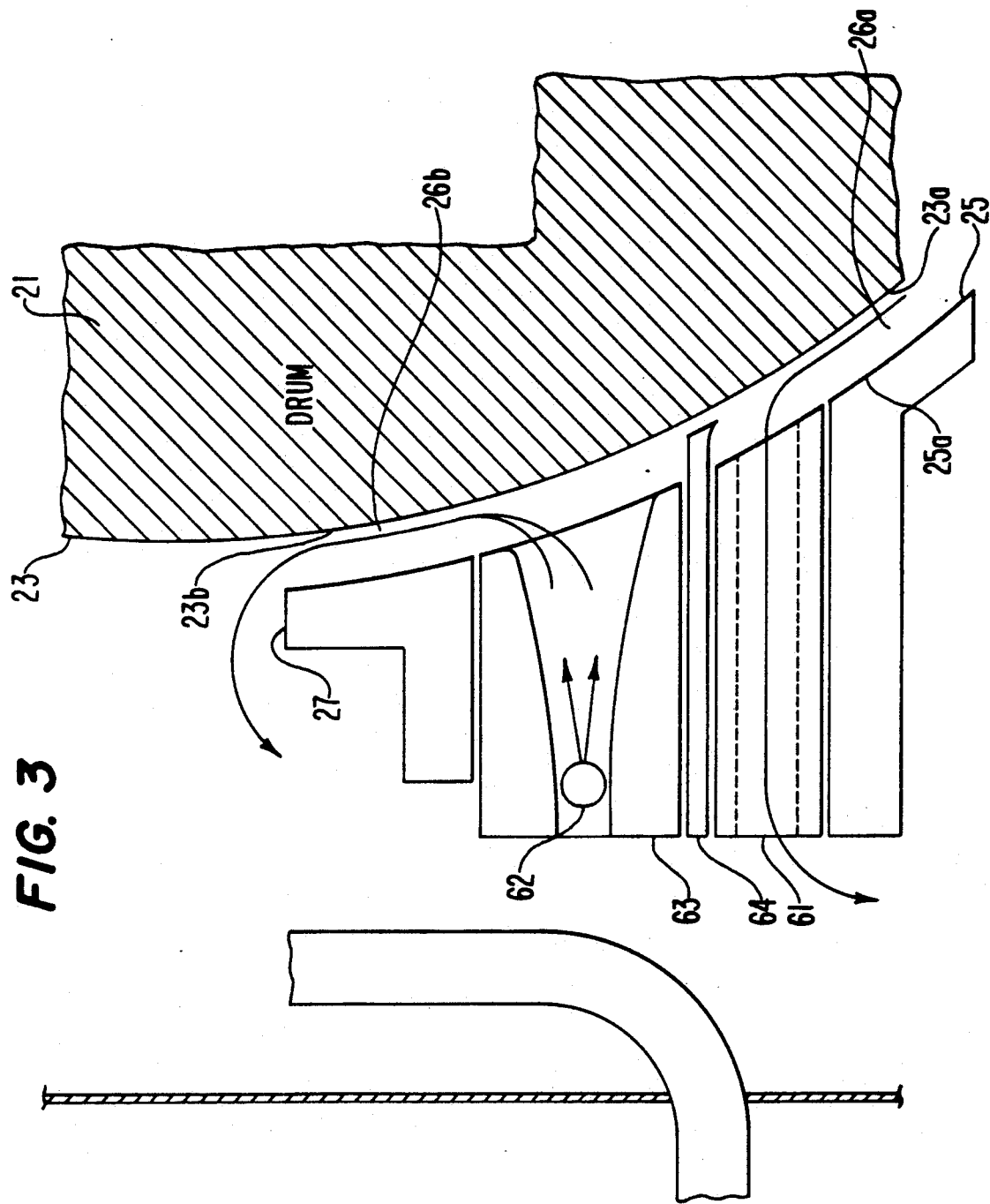

LOW PROFILE COPPER FOIL AND PROCESS AND APPARATUS FOR MAKING BONDABLE METAL FOILS

FIELD OF INVENTION

This invention relates to electrolytic metal foil and to a process and apparatus for producing copper foil, and more particularly, to a process and apparatus for producing a copper foil for fabrication of printed circuit boards for electronic applications.

BACKGROUND OF THE INVENTION

A conventional process for making electrolytic copper foil consists essentially of two steps: first, electrodeposition, or plating, of a "base" foil on a rotating drum-cathode and second, passing the foil through a "treater" machine, in order to provide the matte side of the foil with a bondable surface suitable for bonding to a polymeric substrate. The latter step is sometimes called the bonding treatment.

Traditionally, these two operations are separated by the foil manufacturers, since they seem to be mutually exclusive: formation of base foil calls for a concentrated, hot copper sulfate/sulfuric acid electrolyte, in order to yield a strong, ductile and compact deposit which forms the body of the foil, while the bonding treatment usually requires a more dilute and colder electrolyte which yields fragile, powdery deposits whose role is to enhance the true surface area of the matte side of the foil and thus enhance the bonding ability of the foil.

In a typical process, the first step, fabrication of the base foil, or "core", is primarily responsible for imparting to the bulk of the foil the combination of physical, metallurgical and electrical properties desired in the printed circuit industry, and obviously, those properties are determined by the microstructure of the bulk of the foil, which in turn is determined by purity and conditions of the plating process. Typical properties of the core of the foil sought by printed circuit board manufacturers are suitable tensile strength, yield stress, elongation, ductility and resistance to fatigue. Many of properties relate to the maximum load the material may withstand before failure, and are usually derived from stress-strain curves. Similarly, conductivity is considered an important property of copper foil. All these properties of copper foil depend on the foil's microstructure, but particularly on the microstructure of the core of the foil.

This microstructure, responsible for foil's properties, is in turn determined by the electrodeposition conditions.

Similar to other materials used in high technology applications, copper foil is a composite; i.e., it has a near-surface region with properties differing from those of the bulk material. Thus, the bulk of the copper foil (core) serves in printed circuit boards as the conductor of electricity. The matte side of the foil is responsible for promoting a permanent bond to the polymeric dielectric (insulating) substrate or prepreg, e.g., glass fabric impregnated with epoxy resin.

Metallographic cross-sectioning of copper foil reveals that the foil's two top surfaces are not the same. While the surface next to the drum, the shiny side of the foil, even when viewed under great magnification, is relatively flat and smooth, the surface next to the electrolyte, the matte side of the foil, after application of the bonding treatment is composed of extremely dense and uniform coating of spherical micro-projections which greatly enhance surface area available for bonding to the polymeric substrates.

It is to be understood that the "matte" side of the finished foil, i.e., the base foil plus treatment, refers to the combined effect of the micro-topography of the matte side surface of the base foil (electrodeposited at the drum machine) and the bonding treatment plated upon that surface at the treater machine. Both are equally important.

The cross-sections of the foils depicted in FIGS. 4(a)–(e) illustrate cross-sections of one ounce base foil for both conventional regular and low profile foils and foil made in accordance with the present invention. Copper foil has a "core" (a solid body of dense metal) and a "tooth", a chain-saw like dense coating of microprojections composed of the micro-peaks of base foil and the bonding treatment. FIGS. 4(a) and 4(b) illustrate cross sections of a regular base foil 10 and a regular base foil 10 plus treatment 11, respectively, wherein the core 10 of the base foil has a matte surface composed of densely packed conical micro-projections 10', the $R_Z$ (average height from the peaks to the valleys) of which is typically about 400 microinches ($\mu''$) and the base foil plus treatment typically has an $R_Z$ of about 600$\mu''$. As shown in FIGS. 4(c) and 4(d), low profile base foil has a core 12 and the micro-projections 12' have an $R_Z$ typically of about 200$\mu''$, while the $R_Z$ of the base foil plus treatment 13 is typically about 300$\mu''$. FIG. 4(e) depicts foil made in accordance with the present invention which is also a low-profile foil, but the micro-projections 15 are more spherical than in the case of conventional low profile foil.

There is the question of how to determine the gauge of copper foil destined for electronic application—the weight per unit of surface area vs. the actual thickness. The former is most often used, and foil weighing one ounce per one square foot is called one ounce foil (1 oz.).

Such designation is now considered not adequate by the designers of electronic circuits and equipment, since the mass or the thickness of the "core" is pertinent in assessing the gauge (from the electrical viewpoint) of the foil, while the "tooth" is not.

Thus, it is now believed that the foil is better characterized by its thickness, measured by micrometer, since it takes into account the profile (cross-section) of the foil and the ratio between thickness of the core and the matte height, or the "tooth" (combined matte height of the foil and the treatment).

Since micrometer measurement includes peaks of the base foil and the peaks of the treatment upon them, a foil with a pronounced matte side of the base foil and with a large amount of treatment will be thicker than a foil with a less pronounced base foil matte structure and a lesser amount of the treatment, even if the weight areas of both foils are the same. The thickness of 1 oz. foil can be as different as 1.8 mil and 1.4 mil, as shown in FIGS. 4(b) and 4(d). The industry trend is toward "thinner" foil in these terms. Such foils are referred to as "low profile". Foil with a rectangular cross-section would be considered ideal, theoretically, if the foil's bonding ability were not an important consideration. However, it is widely agreed that the matte height of the foil should not exceed 15% of foil total thickness. Only such foils are used in fabrication of multi-layer boards, the most advanced and fastest growing segment of printed circuits industry.

Matte height is routinely measured by copper foil manufacturers and users, with a stylus type instrument which measures peak to valley amplitude.

Traditionally, in electroplating, the type of deposit that is best for the properties of the core of the foil is obtained from hot, concentrated electrolytes with moderate current densities. The type of deposit that is best for the properties of the matte surface or bonding surface are obtained from colder and more diluted electrolytes, with high current densities. Thus, the fabrication of the base foil and the bonding treatment are typically separated.

This, however, is a traditional view, since one can obtain very different crystalline structures in the electrodeposited copper, using the same electrolyte, by varying the other factors pertaining to the mass transfer.

In recent times, considerable advances have been made in the application of mass transfer principles to the practice of electroplating. For example, it is known that turbulent, rather than laminar, flow of the electrolytes in the anodecathode gap can increase limiting current densities, since the former can decrease diffusion-layer thickness.

U.S. Pat. No. 3,674,656 discloses a technique using a secondary anode delivering a relatively high current density to promote high-profile, high-bond matte height. While good bonding ability is achieved, the matte side of the foil, by the patent's own description is "highly roughened", in the form of "tree like growth", and would not satisfy the requirement of low-profile cross-section.

International patent No. WO8703915 teaches a technique that combines agitating the electrolyte while using a secondary pulsed current having a current density greater than the limiting current density to produce copper foil having a nodularized outer surface. This technique, however, apparently does not achieve fabrication of low profile foil.

On the other hand, while low profile copper foil is currently achieved for commercial sale, it is achieved at the expense of very low production rates and/or at very low yields. It is believed that this foil production is achieved by very careful control of the more traditional process and equipment.

Such a prior art process, illustrated in FIG. 6, involves not only the separate step of treating the matte surface for bonding ability, but also a subsequent encapsulating or gilding step, a subsequent deposit of a barrier layer, typically a zinc layer, followed by a stain-proofing step (passivation) and followed by rinsing, drying and cutting. Such prior art processes are complicated and costly.

SUMMARY OF THE INVENTION

It is an object of this invention to solve the abovedescribed problems, and to provide an improved copper foil and an improved method and apparatus for producing such foil.

To achieve the objects of the present invention there is provided a one-step electrolytic process for producing metal foil having a low-profile treated surface, which process comprises passing an electric current through an electrolyte solution containing a concentration of metal ions from a primary anode to a cathode spaced from the anode in a first electrodeposition zone at a first current density while circulating the electrolyte between the cathode and primary anode under turbulent flow conditions to electrodeposit on the cathode primary metal foil having a matte surface composed of densely packed conical micro-peaks and valleys; passing an electric current through an electrolyte solution containing a concentration of metal ions from a secondary anode electrically insulated from the primary anode to the cathode in a second electrodeposition zone at a second current density greater than that in the first zone while circulating the electrolyte in the second zone between the cathode and the secondary anode under laminar flow conditions to electrodeposit micronodules of the metal on the matte surface. Preferably, a grain refining agent is employed in the electrolyte solution to aid in producing a foil having the most desired properties.

In accordance with the present invention there is also provided a unique copper foil which is produced by the abovementioned process.

In still another aspect of the present invention there is also provided a novel apparatus for the electrolytic production of a metal foil comprising:

(a) a rotatable drum cathode having a leading portion and trailing portion;

(b) a primary anode spaced from and opposite the leading portion of the cathode and having a terminal end portion;

(c) a secondary anode adjacent the terminal end portion and spaced from and opposite the trailing portion;

(d) means for withdrawing electrolyte positioned adjacent the terminal end portion;

(e) means for introducing electrolyte adjacent the secondary anode; and (f) a baffle positioned between the means for withdrawing electrolyte and the means for introducing electrolyte and extending toward the cathode.

Other features and advantages of the invention will become apparent from the following description or may be learned from practicing the invention.

BRIEF DESCRIPTION OF THE DRAWINGS

The accompanying drawings, which are incorporated in and constitute a part of the specification, illustrate the presently preferred apparatus and method of the invention and, together with the general description given above and the detailed description of the preferred embodiment given below, serve to explain the principles of the invention. Of the drawings:

FIG. 3 is a partially pictorial and partially schematic illustration of further implementation details of the secondary anode area apparatus of FIG. 1;

DESCRIPTION OF A PREFERRED EMBODIMENT OF THE INVENTION

Figure 1:
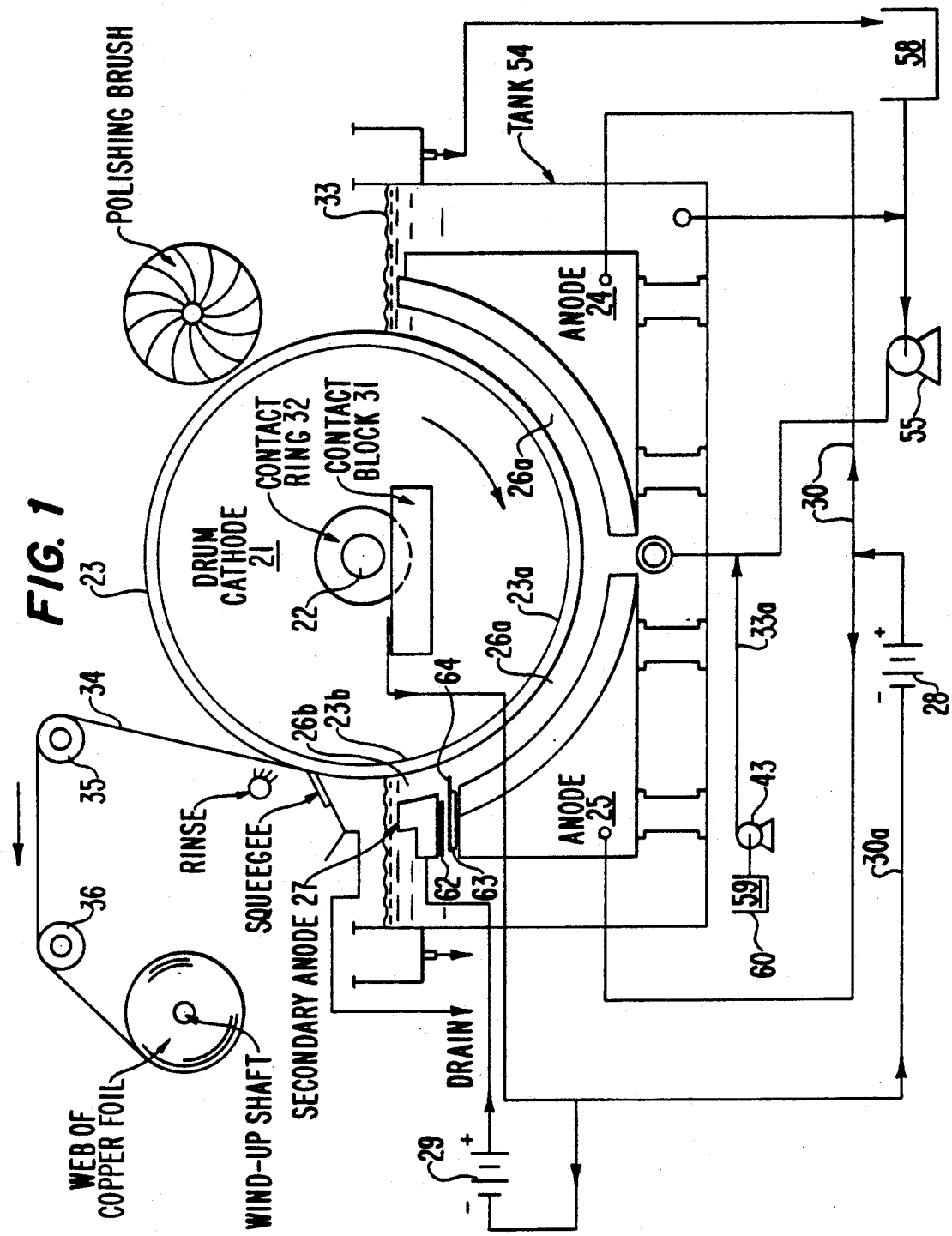
FIG. 1 is a partially pictorial and partially schematic illustration of a combined foil deposition and bonding-surface treatment apparatus according to the present invention.

Reference will now be made in detail to the presently preferred apparatus and method implementing the principles of the present invention, as illustrated in the accompanying drawings, in which like reference characters designate like or corresponding parts throughout the several drawings.

As illustrated in FIG. 1, fabrication of electrodeposited copper foil according to the invention involves the use of a large (e.g., 2.2 meters in diameter) cylindrical drum-cathode 21. Typically, the drum 21 is constructed and mounted for clockwise rotation about its axis 22 and its outer surface 23 is made of, e.g., stainless steel or titanium. The drum is adjacent to and facing toward a pair of heavy, lead (or lead-antimony alloy) curved primary anodes 24 and 25 (insoluble anodes of platinized titanium or iridium or ruthenium oxides can also be used). The surface 23 of drum 21 has a leading portion 23a opposite anodes 24 and 25. The spacing between the nearby facing edges of these anodes provides an entry for the injection of the electrolyte which circulates in the gap 26a between the drum 21 and the inner surfaces of the anodes 24 and 25.

In addition to these two primary anodes 24 and 25, a secondary anode 27, or "super anode" is positioned at the exit side of the machine (drum rotates clockwise). A trailing portion 23b of surface 23 is located opposite the secondary anode 27, and a gap 26b is provided between anode 27 and the trailing portion 23b. Both the drum and each of the anodes are connected electrically by heavy bus-bars 30 to one of two separate (one for main anodes 24 and 25, another for secondary anode 27) D.C. power sources 28 and 29 which are illustratively rectifiers. The bus bars connect to the drum-cathode 21 through contact block 31 and contact ring 32. As the drum rotates in the electrolyte 33 and the electrical current is passed through the electrolyte 33 in gap 26 an electrodeposit of metal, e.g., copper, forms on the drum surface 23, and as the latter leaves the electrolyte, the electrodeposited copper is continuously stripped from the rotating drum outer surface 23 (since the adhesion between copper electrodeposit and the drum surface is low) in the form of thin foil 34. A metal ion-containing electrolyte 33 is pumped into the gap 26 through one or more feed lines 33a from a dissolving tank 58, and the drum 21 is at least partially immersed in the electrolyte. The foil 34 at this stage has a matte side (the side facing the electrolyte) and a shiny side (the side facing the drum). The matte side has an improved bonding capability (as will be explained later). As the foil 34 is stripped from the drum surface, it is fed by means of driven rollers 35 and 36 (similar to the way in which a web of paper is handled in a printing machine) into two consecutive plating tanks (not shown here, but see FIG. 2) and subsequently slit into strips and wound on a reel.

Figure 2:
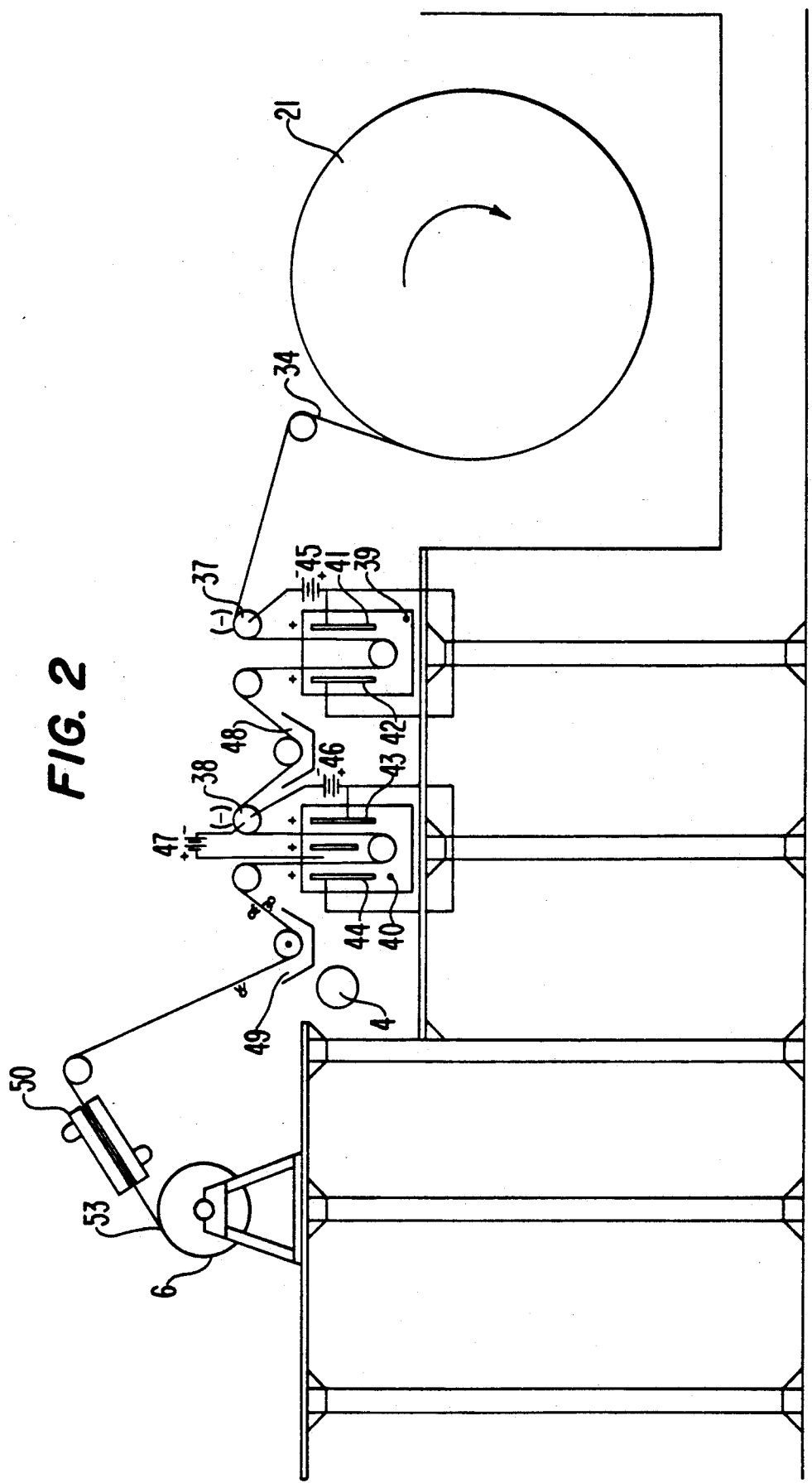
FIG. 2 is a partially pictorial and partially schematic illustration of a deposition, treatment and foil finishing system employing the arrangement of FIG. 1.

As illustrated in FIG. 2, foil 34 is rendered cathodic by means of contact rollers 37 and 38 and passes in a serpentine fashion through tanks 39 and 40, facing the rectangular anodes 41, 42, 43 and 44 as shown. Each tank has its own supply, respectively, of an appropriate barrier layer electrolyte and a stain-proofing electrolyte and its direct current power source(s) 45, 46 and 47. Between the tanks, the foil is thoroughly rinsed on both sides in baths 48 and 49.

The purpose of this latter stage of operation is to electrodeposit on the matte side of the foil a barrier layer of zinc as described in U.S. Pat. No. 3,857,681. Alternately, a zinc-antimony-nickel barrier can be deposited, as described in U.S. Pat. No. 4,572,768. Zinc plating or zinc-antimony-nickel plating is conducted in the first plating tank 39, while in the second tank 40 the foil is subjected to the electrolytic stain-proofing conducted in an aqueous solution of chromium salts, e.g., according to U.S. Pat. No. 3,853,716 or U.S. Pat. No. 3,625,844.

After the final rinse, but before drying, optionally the matte side of the foil can be sprayed with a dilute solution (e.g., about 0.3% or 0.5%) of a primer or coupling agent (not shown). "Coupling agent" represents the best name and description a variety of chemically reactive bodies which are used in the glass-reinforced plastic industry. (See page 194, *Adhesion And The Formulation Of Adhesives*, William C. Wake, Elsevier Publishers).

Glass reinforced epoxy "prepreg" is the most popular polymeric substrate used in the fabrication of printed circuits, and the water soluble glycidoxy silane is the most popular primer used in the fabrication of epoxy-glass composites. Therefore, it is preferred that the bonding side of the foil is provided with a dry residue of such primer, to improve the performance of copper clad laminate as well-known in the art.

After the foil is dried in dryer 50, it can be slit to a desired width and coiled into the roll 53. Also, at this stage the foil can be inspected and subjected to quality control tests, preparatory to shipping. The present foil manufacturing process can thus be conducted in a one-step operation which does not require the prior art separate dendritic and gilding deposit treatments.

Figure 6:
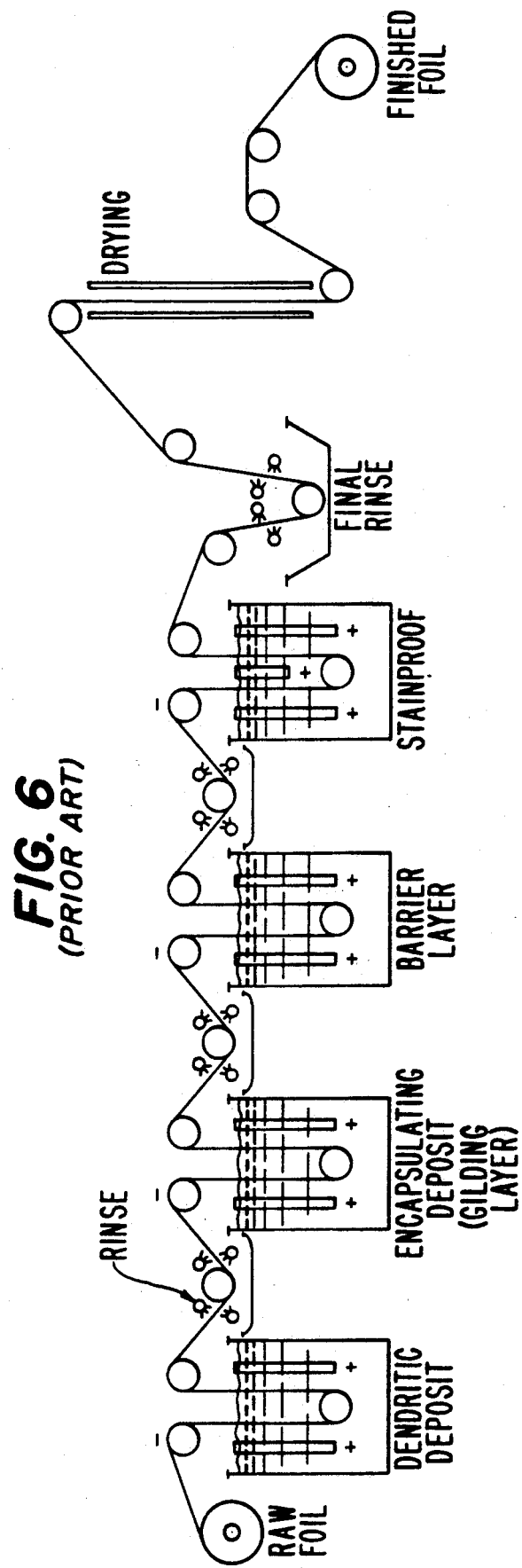
FIG. 6 illustrates a prior art system for producing copper foil for application in the field of printed circuit boards and related uses.

Further, the prior art treatment of FIG. 6 is avoided in that the rewinding of the film from the roll 53 is not needed; nor is the relatively higher speed of that process needed. Barrier layer deposition, stain-proofing or, optionally, primer application are performed using conventional methods as described in U.S. Pat. Nos. 3,857,681, 4,572,768, 3,853,716 and 3,625,844, all of which are incorporated herein by reference.

Referring to FIG. 1, at the leading portion 23a of drum-cathode 21, electrodeposition is effected by the passage of electric current across the electrolyte contained in the anode-cathode gap 26a, an annular compartment formed between the drum-cathode 21 and the curved entry and exit anodes 24 and 25 respectively. This part of the electrolytic cell 54 is referred to herein as the "first electrodeposition zone" or "first zone". If, as an example, drum-cathode 21 has a 2.2 m diameter, is 1.5 m wide, and the drum-anodes distance is 1 cm, only about 45 liters of solution is subjected, at any given time, to the electrolysis. On the other hand, electrolytic cell 54, which is a rectangular tank containing the body of electrolyte, the anodes, and the immersed portion of the drum, and holding about 3,000 liters of electrolyte 33. One or more recirculating pumps 55 inject the electrolyte solution under pressure through a conduit into the gap 26a, thus producing an upward flow of high velocity which is great enough to create turbulent flow conditions in the gap 26a in the first electrodeposition zone. If desired, other means may be used to create such turbulence.

In an industrial scale copper foil operation, concentrations of both copper sulfate and sulfuric acid in the electrolyte have to be maintained at a constant level. This is accomplished very simply. Foil producing electrodeposition machines, in terms of electrolyte supply, are a part of a continuous loop which also involves dissolving tank 58 into which fresh, pure wire copper scrap is added on a continuous basis and air agitation is used to help dissolution of the scrap in the electrolyte. Electrolyte flows constantly from the dissolving tank to the plating machines where it is circulated, back to dissolving tank and so on. In the plating machines, copper concentration tends to decrease (since copper foil is plated out) and acid concentration tends to increase, while in the dissolving tank copper concentration tends to increase back to normal due to dissolution of the scrap material and acid concentration tends to decrease since dissolution of the scrap consumes excess acid. Thus, the whole process is balanced.

The system is equipped with a supply of aqueous solution of grain-refining agent 59 (inhibitor). This solution of, e.g., 5 grams inhibitor per liter (g/l), is prepared in a separate container 60, and then injected by a metering pump 43, at an appropriate rate, into a line, e.g., from pump 55, that supplies the machine with fresh electrolyte. Inhibitors, sometimes called grain refining agents, are consumed in the plating process. The addition rate is usually expressed in terms of dry weight added to the plating machine per unit of time, e.g., in milligrams per minute (mg/min). Another way of expressing the usage thereof is as a measure of the amount (weight) of dry refining agent necessary for the production of a given amount of foil endowed with necessary physical and bonding properties. In accordance with the present invention, about one kilogram of the inhibitor is typically used for the production of one metric ton of good copper foil.

Refining agents used in electroplating are usually macro-molecular, water soluble colloids and polymers. Most popular are organic inhibitors such as gelatin, animal glue, cellulose ethers, polyacrylamide, and the like. They can be used separately, but mixtures are preferred, since mixtures can impart to electrodeposits properties impossible to obtain using a single inhibitor. A mixture of gelatin having a low molecular weight (less than 10,000), a higher molecular weight gelatin and a hydroxyalkyl cellulose such as hydroxyethyl cellulose has been found to be highly effective in obtaining a matte structure that is characterized by high bond and low profile height.

FIG. 3 illustrates in greater detail the terminal portion 25a of primary exit anode 25 which is spaced apart and electrically insulated from secondary anode 27. The turbulent electrolyte flows upwardly in gap 26a, exits the first zone through a main solution exit 61 and is returned to the main body of electrolyte in tank 54. The solution leaving gap 26a at exit 61 takes with it the oxygen bubbles generated at the primary anode in the course of the electrodeposition of the core foil. The main solution exit 61 is a slot formed in an insulator block formed of a dielectric, e.g. an insulating resin such as polypropylene, which separates and electrically insulates anodes 25 and 27. Fresh electrolyte from head tank 54 is introduced into gap 26b using a distributor 62 which is positioned above exit 61 adjacent secondary anode 27 which is opposite trailing portion 23b of drum surface 23. Distributor 62 is formed, e.g., of a perforated pipe located in a hollowed out block 63 of a suitable plastic such as polypropylene. In the second electrodeposition zone, the volumetric feed rate of the fresh electrolyte is low enough to maintain laminar flow conditions in gap 26b. Under such conditions when a direct electric current of about 4000 amps is passed from secondary anode 27 through the electrolyte in gap 26b a super-anode matte surface is formed (on the core foil) which has a microstructure resembling that depicted in FIG. 4(e).

Preferably, a baffle 64 formed, e.g., of an insulating plastic such as polypropylene, is positioned above the main solution exit 61 and extends across the gap 26 toward drum 21 to force the upward-flowing electrolyte from the first electrodeposition zone to exit gap 26a through exit 61.

Summarizing, the present invention employs the use of turbulent, high velocity recirculation of electrolyte in the first electrodeposition zone and laminar flow of electrolyte and a higher current density in the second electrodeposition zone. Thus, the bulk of the foil (the core) is electrodeposited under the condition of turbulent flow, which is conducive to the production of foil with excellent mechanical properties (high tensile strength and elongation, at room temperature and 180° C.). The matte surface created in the second electrodeposition zone resembles that formed by conventional treatment processes and provides a much higher peel strength than ordinary base foil. The peel strength of foil produced in accordance with the present invention is further enhanced when the matte side of the foil is plated over with a zinc or zinc-nickel barrier layer, stain proofed and treated with a silane primer. A typical foil according to the present invention has a peel strength of about 11 lbs./in, and the roughness of the matte side ($R_Z$) does not exceed about 300 microinches (7.5 microns). In accordance with the present invention, lower than normal copper concentration in the electrolyte can be used, because turbulent flow helps in producing good, porosity-free foil at concentrations as low as 50 g/l and low copper concentration promotes the formation of a more desirable matte surface.

The above-described techniques produces a copper foil which, when used with a prepreg, has improved peel strength by combining interlocking between the foil and the prepreg, with chemical enhancement of the adhesion between the metal and the polymer of the prepreg. This is different from the conventional situation when all the peel strength is achieved by mechanical interlocking.

Figure 4B:
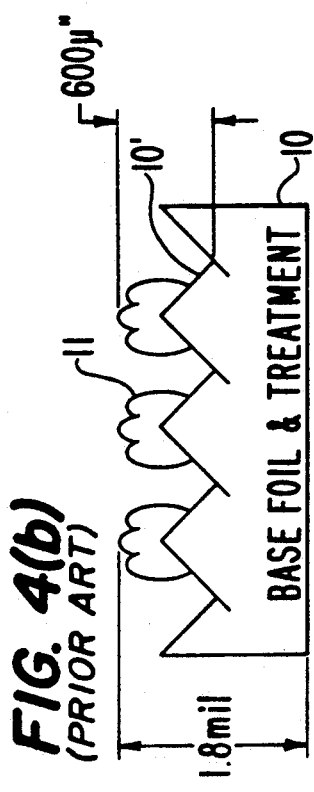
FIGS. 4(a)–(e) illustrate typical foil cross sections for regular foil, low profile foil and foil in accordance with the present invention.
Figure 4A:
Figure 4D:
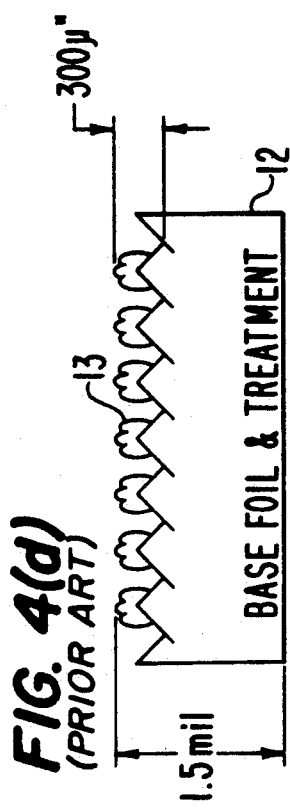
Figure 4C:
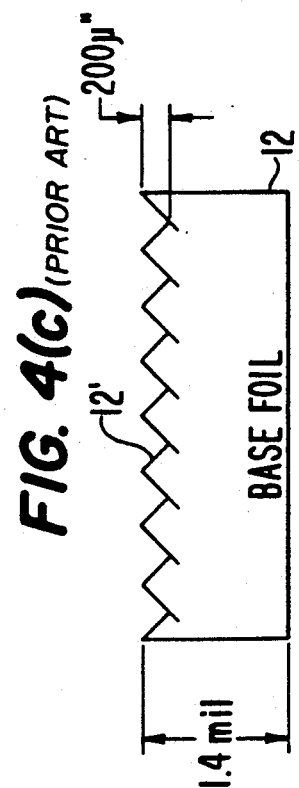
Figure 4E:

The process and apparatus according to the present invention combines the formation of the base foil, or core, and the bonding treatment into a one-step process wherein, during the electrodeposition process, any particular portion of the drum surface 23 faces first primary anodes 24 and 25 in a first electrodeposition zone and then the secondary anode 27 in a second electrodeposition zone. In the first zone, the relatively smooth face side, the core and the matte surface of the foil are created, using a current density having a value much lower than the limiting current density, which is determined by mass transfer considerations. Under these circumstances, the "core" of the foil is constructed of small, densely packed grains, which assures excellence of the physical properties of the foil which has some inhibitor particles included therein. The matte surface of the core of the foil is composed of very densely packed, conical microprofiles (peaks and valleys), the peaks being typically about 150 microinches high and spaced about 150 microinches from one another. In the second zone, the rotating drum 21, covered with the "skin" of copper foil on its top surface enters a radically different set of conditions opposite secondary anode 27. The current density here is three or more times higher than in the first zone, therefore its value comes much closer to the limiting current density. Therefore, in the second zone the mass transport properties are drastically poorer than in the first zone opposite the primary anodes 24 and 25. Under such conditions, the copper crystal growth becomes field-oriented which leads to the electrodeposition of somewhat more spherical microprojections, as illustrated in FIG. 4(e), which greatly enhances the matte side's surface area and thus provides the foil with an improved bonding ability (higher peel strength). These micro-projections act as a traditional treatment (dendritic layer followed by gilding layer, as described in U.S. Pat. Nos. 3,857,681 and 4,572,768) but are actually better, since the microprojections are composed of much harder copper than the particles of the traditional treatment, and are firmly bonded to the core and therefore are less given to the "treatment transfer". At the surface of electrolyte 33, the second zone ends and the bonding treatment is completed, with the combined height of the matte side and the treatment being about 300 microinches in the embodiment described herein. This product is referred to as low profile copper foil.

The behavior of grain refining agents (inhibitors) is important in the successful operation of the present drum-treatment process. It is generally known, in the domain of electroplating, that such inhibitors promote smoother, smallgrain deposits. However, when the current density of the process approaches its limiting value, refining agents promote field-oriented, dendritic, or tree-like deposits. Thus, when electrodeposition is conducted in the first electrodeposition zone with primary anodes 24 and 25 at a current density much lower than the limiting current density, refining agents help in the deposition of fine-grained and strong foil. Once the drum rotates, however, into the second zone, the secondary anode zone, wherein the current density approaches its limiting value, refining agents help in promoting the formation of more spherical micro-projections, which provide superior bonding ability.

The improved results obtained in practice of the present invention may be explained as follows. Not only is the diffusion layer thicker in the second zone than in the first zone; but as the drum enters the second zone, the exterior surface of the foil has a well developed matte side microprofile.

Figure 5:
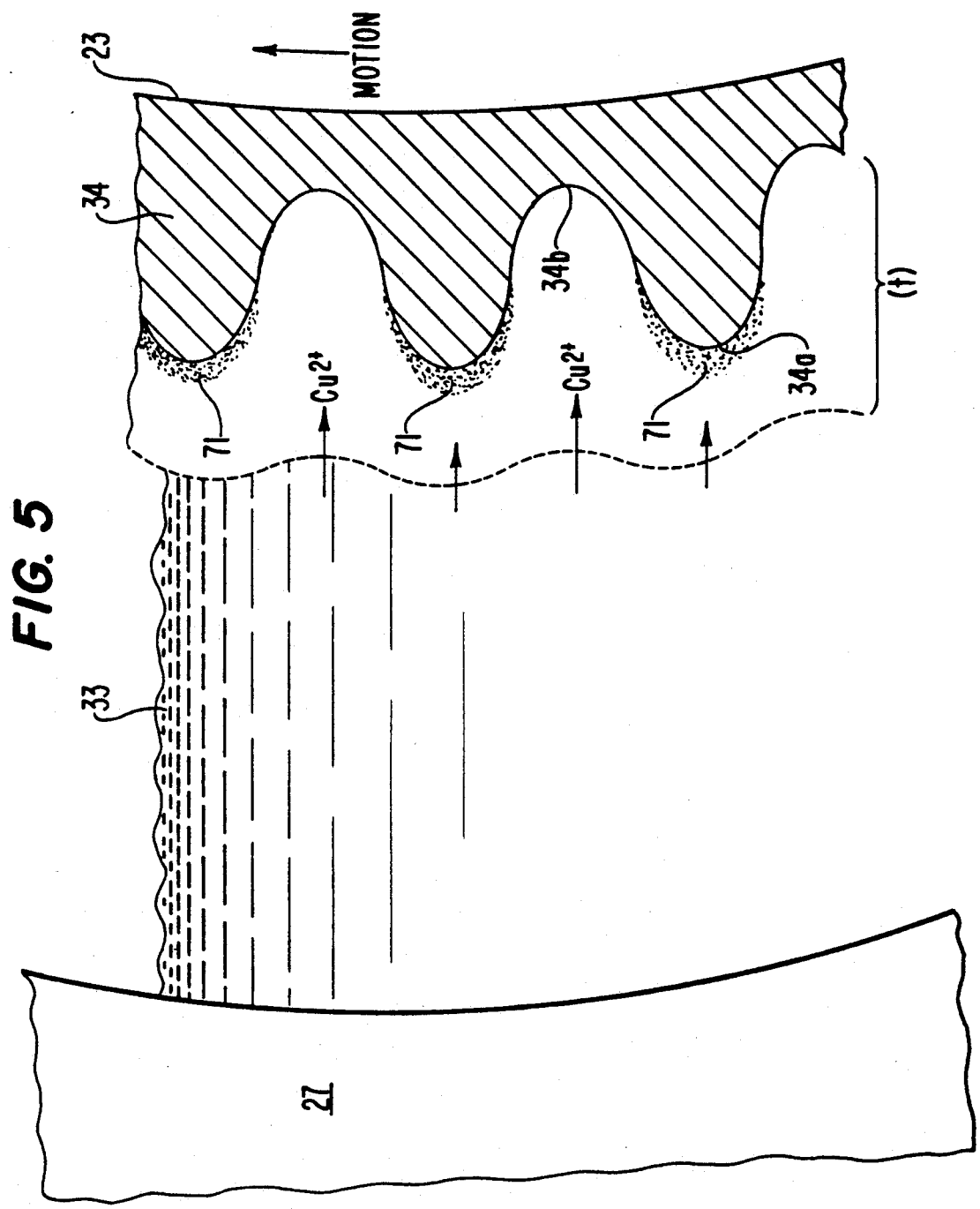
FIG. 5 illustrates the action of the inhibitor particles in the diffusion zone in the preferred implementation.

As shown in FIG. 5, the matte side of foil 34 is not smooth, but is composed of peaks 34a and valleys 34b. Since the amplitude ($R_Z$) from peak to valley has a dimension about equal to the diffusion layer thickness (t), the diffusion layer cannot follow the surface profile and is thinner at the peaks than in the valleys. When the diffusion layer is not significantly thicker than the matte surface average peak-to-valley depth, the inhibitor species concentration will be directly related to the distance from the core. The secondary anode deposition, consequently, favors the peaks and the formation of spherical caps (as shown in FIG. 4(e)) which are good for bonding to polymeric substrates.

To summarize: in the practice of the present invention the unique combination of the applied current densities, the electrolyte flow conditions and the inhibitor, as described above, creates the conditions for the production of core foil having a superior bonding treatment and the resulting low profile matte height not greater than about 300 $\mu$m.

Separately, the above factors do not achieve such results. For example—high velocity flow, well known in electroplating and the copper foil making, just by itself, helps in creating of the smooth matte side, with little bonding ability, while high current density in the zone at the end of foil making process causes formation of a too prominent matte height (with or without turbulent flow) if refining agents of a sufficient number of particular different species and concentration are not used.

Aside from the obvious economic advantages that the elimination of steps offers over the traditional foil making and treatment process, the present invention also offers an advantage in terms of quality. The described drum-treatment, due to its low-profile and the absence of breaking off, or transfer, of the nodules, or microprojections, is better than the traditional treatment.

Since the actual height of the micro-topography of the bonding side of the foil is typically lower than 300 $\mu$m, the actual time necessary to etch away unwanted foil to form a desired circuit configuration on the printed circuit board is shortened considerably, as compared to the standard foil, and the dielectric properties of the board are improved.

Low profile foil provides a desirable cross-section which is closer to rectangular-shaped cross-section of the fine circuit lines. This, in turn, will give better line definition, improved layer to layer dielectric thickness in the fabrication of multi-layer printed circuit board, and the better dimensional stability of the boards.

By way of particular example for the operation of the apparatus of FIGS. 1 and 3, the following is offered. In the preferred plating apparatus, the space between the anodes is constricted so that one can use the forced flow of the electrolyte. The pumps (preferably separate for entrance and exit anodes) are capable of a flow rate of over 200 gallons per minute (g/min.), per anode. If one considers as an example that such flow—800 liters per minute (l/min.) or 800,000 cubic centimeters per minute (cm$^3$/min.) gushes through the gap of 60" or 150 cm wide with the spacing of 1 cm, e.g., cross-section of 150 cm$^2$, it can be seen that the flow generates within the gap, an electrolyte velocity of about 1 meter per second (m/sec.)

This so dramatically improves mass transfer properties, as compared to a convection approach to the process, that a much lower concentration of electrolyte can support drum operations. Indeed, experimental use of the invention has demonstrated that excellent 1 oz. and ½ oz. foils, characterized by excellent mechanical properties, and a very uniform matte side can be produced employing an electrolyte having a copper concentration of 35 grams/liter. Such concentration is, in turn, sufficiently low to make the combined deposition and treatment process, as described, even more practical and versatile. The secondary anode 27 should, in all cases, be biased with respect to the main anodes 24 and 25 to provide a higher current density in the second zone than in the first zone.

A further discussion, helpful to understanding the principles of the invention, follows.

Electrodeposition takes place on the interface of two phases: solid (the cathode) and liquid (the electrolyte). In the course of electrodeposition a new solid phase is produced on the surface of the cathode—the electrodeposit, due to the cathodic reduction:

$$Cu^2 + 2e \rightarrow Cu^*$$

Although metal is continuously removed from the solution adjacent to the cathode during electrodeposition, the concentration of metal ions at the cathode-solution interface does not continuously decrease, because certain natural agencies—diffusion, convection and electrical migration of ions—transport metal ions from the body of the electrolyte to the cathode. Ultimately, a balance, or steady state, is set up in which metal ions are replenished at the cathode by these agencies at exactly the same rate at which they are removed.

The region of depleted metal concentration does not extend very far from the cathode. Most of the concentration changes occur within a thin layer of solution adjacent to the cathode. It is called the cathode film or, more accurately, the diffusion, or boundary, layer. An understanding of the nature of this diffusion layer is of primary importance in applying diffusion theory to electroplating.

The restriction of the cathode diffusion layer to a thin, fairly definite layer is due to the operation of two hydrodynamic influences. These are the adhesion of the liquid to the cathode surface and the viscosity of the liquid. According to hydrodynamics, in laminar flow, the liquid adjacent to a surface, because of adhesion to the surface, has substantially zero velocity. Because of the liquid's viscosity, its velocity increases rapidly from zero to that of the main stream, linearly with distance from the surface. The adhesion of the liquid to the cathode and its viscous drag prevent the convection currents from completely sweeping away the depleted solution from the vicinity of the cathode and ensures that a depleted region persists there. On the other hand, the cathode diffusion layer would probably grow indefinitely in thickness if it were not for the vertical component of the convection current which, at a short distance from the cathode, attains a sufficient velocity to sweep away the depleted solution. This occurs at that distance from the cathode where the influence of adhesion and viscosity in restricting flow has greatly fallen off.

If the fluid velocity at the solid-fluid interface is considered to be zero, the velocities close to the solid surface are, of necessity, small; however, the velocities increase as the distances from the surface increase. This demonstrates the importance of hydrodynamical and fluid mechanics aspects of the electrodeposition.

This gradient of velocity, called a boundary layer, is responsible for the existence of the electrolyte's concentration gradient and, in turn for existence of the diffusion layer, the limiting current density, mechanism of mass transport in the electrodeposition, and the influence of mass transport on the structure (and therefore on the properties) of the electrodeposits.

The very term "transport" suggests motion and mobility necessary to deliver copper ions to the cathode (matte side of the foil) as quickly and copiously as they are plated out at the cathode.

Of the three methods of ionic transport only one—convection (natural or particularly artificial stirring or agitation of the electrolyte) is very effective in bringing fresh supplies of ions toward the cathode. But at the surface of the cathode itself, and for a very short distance away from the surface (thickness of the boundary layer) convection does not operate, because the electrolyte is almost immobile. Fast transport stops here, and that last, very short, but extremely important distance (from the outer extremity of boundary layer to the surface of the cathode) has to be negotiated through the forces of ionic migration, the least effective mode of transport, diffusion. Diffusion is the movement of a chemical species, either ionic or uncharged, through the solution as a result of a concentration gradient. It is a result of random motion of the ions or molecules, which tends to produce more uniform distribution of the various species throughout the solution. Thus the depletion of a species next to the cathode results in a movement of that species from the bulk of the solution toward the cathode.

This region next to the electrode, where the concentration of any chemical species differs from its concentration in the bulk of solution, is called the diffusion layer. The boundary between the diffusion layer and the bulk of solution is not a sharp line; it has been defined arbitrarily as the region where the concentration of any species differs from its concentration in the bulk of solution by 1 percent or more. In this region, as has been stated, convection is negligible.

The rate of diffusion, R, is proportional to the concentration gradient at the electrode. The proportionality constant D is called the diffusion constant. The rate may be expressed as:

$$R = D(C_o - C_e)/\delta N$$

Where $C_o$ is the bulk concentration, $C_e$ the concentration at the electrode surface, and $\delta N$ is the effective thickness of the diffusion layer (sometimes called the nernst thickness). The difference between $C_e$ and $C_o$ causes concentration polarization. As $\delta N$ decreases, diffusion rate increases. Agitation decreases $\delta N$, thus increasing the diffusion rate.

Diffusion is, by far, a slower and less effective mode of transport than convection, and it represents a bottleneck in terms of maximum rate at which electrodeposition can be carried.

If the electrical current of the electrodeposition process causes the "plating out" rate to be faster than the ability of the mass transport to deliver new ions, through the "stagnant" diffusion layer and to the cathode, the interfacial concentration of the ions will be zero, and the corresponding current density is called limiting current density.

Electrodeposits are "crystalline", i.e., are composed of "building units", each of which is an arrangement of atoms repeated in three mutually perpendicular directions. Crystals which touch each other in a continuous fashion to make up metallic body are called grains. Grain size and orientation of electrodeposits vary widely causing variation of the deposit's "texture" or "morphology", e.g., variation of the deposit's macroscopic and microscopic crystallographic characteristics.

As mentioned before, crystal growth consists first of the formation of nuclei or minute new crystals followed by the growth of existing crystals. Any "plating condition" that increases the rate of formation of nuclei tend to increase the number of crystals, while the opposing conditions inhibit the increase.

The term "plating conditions" is intended to refer to the conditions of replenishment of metal ions at cathode-electrolyte interface, in other words the mass transfer. Those plating conditions which increase mass transport will also encourage the growth of existing crystals, while those conditions which decrease mass transport will encourage formation of new nuclei. Since the ratio of these two processes—formation of new nuclei versus the growth of existing crystal—determines the structure of the electrodeposit, it follows that mass transfer determines the structure of the electrodeposits.

In turn, it is seen from the mass transfer equation that the J/Jdl ratio depends largely on the thickness of the diffusion layer, which in turn depends on the hydrodynamic conditions of the electrolyte, in this instance, the hydrodynamic conditions in the anode-cathode gap.

The mass transfer rate is proportional to the difference between the ion concentrations in the bulk of electrolyte and at the interface and inversely proportional to the diffusion layer thickness. The present invention advantageously utilizes this relationship.

Thus, in the first electrodeposition zone responsible for the electrodeposition of the 'core' of the foil, under the conditions of excellent mass transfer due to the high velocity of the electrolyte and moderate current density, the diffusion layer is very thin and the difference between copper concentration in the bulk of the electrolyte and the liquid-solid interface, is quite low. Copper plated under such conditions and in addition in the presence of refining agents, has a micro-structure that consists of finegrained and densely packed, base-oriented crystallites. As a result of such micro-structure the core of the foil is endowed with excellent mechanical and metallurgical properties, indispensable in printed circuit industry. The outer surface of the 'core' is composed of dense, conical, micro-peaks and micro-valleys.

In the succeeding second electrodeposition zone, although the electrolyte is the same as in the first zone, the other conditions that determine mass-transfer are deliberately arranged and maintained as to have a poor mass transfer. Accordingly, such conditions encourage electrodeposition of field-oriented micro-structures deposited densely over the micro-peaks of the surface of 'core' deposit formed in the preceding (first) electrodeposition zone.

Field-oriented growth habit is a result of poor mass transfer and attendant high concentration polarization. These conditions, in turn, are the result of high current density and laminar flow of the electrolyte (i.e., condition of natural convection, as opposed to forced convection in the first electrodeposition zone). Consequently, the diffusion layer is thick and the difference between copper concentration in the bulk of the electrolyte and the liquid-solid interface is high, while the J/Jdl ratio is low. Under such conditions, and in addition in the presence of refining agents the copper electrodeposit consists of dense, spherical micro-projections, distributed densely over the micro-peaks of the surface of the 'core' deposit formed in the preceding (first) electrodeposition zone. This coating of spherical micro-projections constitutes a 'bonding treatment' on the matte side of the foil, since it greatly enhances surface area available for bonding to the polymeric materials. In other words, the second electrodeposition zone produces on the matte side of the foil a deposit characterized by a roughness factor (a ratio of the true area to the apparent area that is best for bonding copper foil to the polymeric substrates.

As a summary, it can be said that in the two electrodeposition zones the growth of two very different electrodeposits (in terms of their micro-structure), having two different functions is achieved by arranging and maintaining in each zone different mass transfer conditions, particularly the hydrodynamic conditions and the current densities. Due to the above differences in and due to the presence of particular refining agents, very different micro-structures of the deposit are obtained in each zone even though the electrolyte in both zones is the same.

The present invention also takes advantage of anomalous behavior of refining agents in respect to the influence these agents have on the microstructure and therefore on the properties and functional applications of electrodeposits.

Refining agents in combination with excellent mass transfer conditions (as represented by J/Jdl ratio) in the first electrodeposition zone diminish the grain size of the deposit and thus help to produce base oriented, fine grained and compact electrodeposit—in short, a structure which assures that the properties and functions of the 'core' of the foil (formed in first electrodeposition zone) are very good. On the other hand, refining agents combined with poor mass transfer conditions, as in the second electrodeposition zone, help to produce field oriented micronodular deposits whose individual particles project outward from the surface of the foil and are micro-spherical in shape. Such spherical microdeposits function excellently as a 'bonding treatment' between copper foil and polymeric substrates.

Because the process variables that affect mass transfer (current density, copper ions concentration, electrolyte temperature, degree of agitation) are not of the same order of magnitude, their effects can be cumulative and interdependent. Thus, by proper choice and quantitative control of these variables one can achieve a desired structure of the electrodeposit which is best suited to fulfill the electrodeposit's technical function.

The electrocrystallization (crystal habit) of electrodeposited metal is affected by the mass transfer of the metal ions to the cathode. In turn, this mass transfer can be characterized by the ratio of the current density and the bulk concentration of the metal ions (C). Conversely, the ratio of current density and the limiting current density (also called diffusion limiting current density, Jdl) may be used to quantify mass transfer. Such ratio may be written as:

$$\frac{J}{Jdl} = \frac{V \times \delta}{n \times F \times D} \times \frac{J}{C}$$

V—Stoichiometric coefficient of $Cu^{++}$
$\delta$—Diffusion layer thickness
n—Number of electrons involved in cathode reaction (2 for copper)
F—Faraday's constant
D—Diffusion coefficient of metal ions From the above, it may be seen that a shift from one type of electrodeposit's structure to another type of structure can be achieved by shifting the J/Jdl ratio, or the J/C ratio.

We have established, empirically, a set of conditions for the electrodeposition of the deposit in the treatment step, or the second zone, which combines high peel strength, with the matte side's low or medium $R_Z$, overall uniformity and pleasing appearance.

For example, the superanode used was 4.5"×60", which amounts to 17 square decimeters $DCM^2$. The maximum current used was about 3400A, with an attendant current density of 200 $A/DCM^2$. These conditions were used with the electrolyte of a "normal" copper concentration of 95 g/l or so. High peel-strength foil was obtained. Obviously, with the electrolytes of lower Cu concentrations, lower current densities can assure similar type of growth.

As a general rule it can be said that at a constant level of gelatin addition rate, increasing current density changes the microstructure of the copper deposit from continuous growth, to discontinuous, multilayer and then field oriented one.

The role of inhibitors, sometimes called refining agents, is perhaps one of the most important factors that influences electrodeposition and treatment process.

In general, it can be said that at a constant current density, increasing the addition rate of gelatin causes the microstructure of the matte to change gradually from baseoriented shapes to field-oriented shapes. However, there appear to be some anomalies. At very low concentrations, gelatin seems to increase copper grain size. With increasing concentrations grain size diminishes (as should be expected). At or close to limiting current densities high concentrations of gelatin cause the formation of powdery deposits.

High velocity of the electrolyte allows for a substantial latitude in lowering copper concentration. Good, non-porous ½ oz. foil was manufactured at a Cu concentration as low as 35 g/l; however, the choice of copper concentration is intimately linked to the choice of current density, electrolyte solution velocity and the addition rate of refining agents. As a general rule, it can be said that at lower Cu concentrations the lower current densities are sufficient to promote the formation of strongly-adhered micronodules.

Temperature is extremely important in the mass transfer since it influences diffusion dramatically. However, temperature influences mass transfer in a manner similar to the copper concentration. Increased temperature changes the microstructure of the deposit somewhat similarly to the increase in Cu concentration; the reverse is also true. It is advantageous to keep the temperature constant, most preferably at about 65° C., although the temperature selected may vary in accordance with other process parameters.

Most preferably about 100 g/l acid concentration is used, but greater or lesser concentrations may be employed in the electrolyte.

The electrolyte velocity is instrumental in achieving uniform and low profile, high bond micro-structures. Turbulent flow thins down the diffusion layer and thus moves the limiting current density to much higher values.

The drum-treater apparatus of the present invention should be equipped with pumps capable of generating an electrolyte velocity in the first zone of up to 3 m/sec. Moving to higher velocity values improves the chances of accommodating, at the same time, criteria of high peel-strength and the uniformity of Rz and appearance of the copper foil.

An extremely low concentration of gelatin greatly influences the structure and thus, the properties of the foil. It appears that one molecule of gelatin may and does influence a very large number of copper ions.

There is little doubt that adsorption of the gelatin is essential to its mode of moderating the copper deposition process and the formation of the bonding surface. Since the gelatin molecules in our electrolyte are charged positively, it is likely that gelatin is subject to electrosorption at the cathode. Adsorption of gelatin tends to reduce the size of the crystals in the deposit. It may be that gelatin behaves as an inhibitor of deposition (on local scale), decreasing the local deposition rate and increasing polarization. Such effects enhance formation of new crystal nuclei on the metal surface and suppress growth of existing crystallites, thus resulting in a finer crystal structure. It follows, then, that on a micro-scale gelatin has a leveling effect on copper deposits.

As discussed above, the boundary of the diffusion layer does not follow the profile contour of the cathode (matte side of the growing foil), but lies farther from the depth of the valleys than from the peaks. The effective thickness of diffusion layer shows, therefore, variations which result in variations of local concentration polarization. Since the potential of the cathode is uniform, differences in the local rate of metal deposition will depend on the diffusion rate of copper ions and molecules of gelatin.

The schematic cross-section of FIG. 5 shows the active deposition phenomenon at an operating cathode (matte side of the foil 34 in electrolyte bath 33) with gelatin 71 accumulated at peaks 34a because the diffusion rate is relatively rapid over the short distance from the diffusion layer boundary, while at valleys 34b diffusion is too slow to keep up with consumption of gelatin. Copper deposition is relatively inhibited at the peaks but not in the valleys, and thus a smoother surface results.

Gelatin's "action" takes place on the surface of the cathode. The surface of the cathode is the site of physiochemical activity between the phases and it is responsible for such phenomena as adsorption, chemisorption, reactivity or catalysis. Obviously, the action and mechanism of impact of addition agents on cathodic processes belong to the domain of surface physical chemistry and the closely related branch of colloid chemistry.

Gelatin and hydroxethyl cellulose are examples of substances used extensively as addition agents in electroplating. Both are hydrophilic colloids. The particular complex structure, colloidal properties of animal gelatin, its electric charge, film forming properties are employed in a wide range of industrial applications, e.g., as a protective colloid, dispersing and clarifying agent, emulsifier and a flocculent. These applications demonstrate, in fact, the influence gelatin might exert on various phenomena which take place on the interfaces between phases. If gelatin alone is used in the process, the bond is adequate but matte height is much too high. Hydroxyethyl cellulose alone helps produce foil with very low matte height, but results in too low a bond. The mixture of gelatin of low molecular weight (less than 10,000) and gelatin of high molecular weight (greater than 10,000) and hydroxyethyl cellulose in a 4:1:1 ratio, helps produce foil that combines high bond with low matte height.

Based upon our experimental work, it is preferred to carry out the process of the present invention using the electrolyte, grain refining agents and plating parameters described below:

| ELECTROLYTE: copper sulfate/sulfuric acid | | |
|---|---|---|
| | Most Preferred | Preferred Range |
| Cu (as metal) concentration | 50 g/l | 30–100 g/l |
| $H_2SO_4$ | 100 g/l | 40–150 g/l |
| temperature | 150° F. | 100° F.–180° F. |

PREFERRED REFINING AGENTS

Stock solution:
low molecular weight gelatin—4 g/l
high molecular weight gelatin—1 g/l
hydroxyethyl cellulose—1 g/l
Addition rate—most preferred—600 mg/min (expressed as dry weight)
preferred range—200–1000 mg/min

PLATING PARAMETERS

Figure 7:
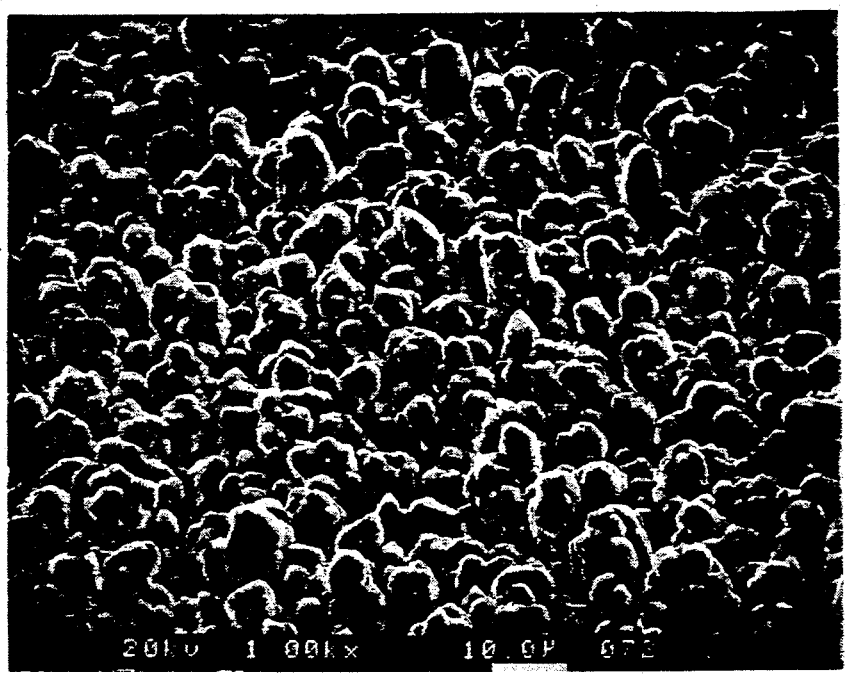
FIG. 7 is a photomicrograph of the matte surface of 1 oz. copper foil made in accordance with the present invention using the most preferred process parameters described hereinbelow; an FIG. 8 is a photomicrograph of the matte surface of copper foil made similar to the foil of FIG. 7, but with the secondary anode turned off.

Fresh Electrolyte Feed Rate 1. into gap between drum and primary anodes
   most preferred—120 l/min
   preferred range—50–200 l/min
2. into gap between drum and secondary anode
   most preferred—40 l/min
   preferred range—20–100 l/min
3. current density (direct current) primary anodes
   most preferred—50 amps per square decimeter
   preferred range—20–100 A/DCM$^2$
4. current density (direct current) secondary anode
   most preferred—200 A/DCM$^2$
   preferred range—100–300 A/DCM$^2$
5. electrolyte velocity in gap between drum and primary anodes to produce turbulent flow
   most preferred—1.5 m/sec
   preferred range—0.8–3 m/sec or more
6. electrolyte velocity in gap between drum and secondary anode to produce laminar flow
   most preferred—only that required to replenish $Cu^{++}$ in electrolyte in gap
   preferred range, stagnant—0.1 m/sec A 1 oz. copper foil was made in accordance with the present invention on a plating machine of the type described above and as illustrated in FIGS. 1 and 3 employing the most preferred plating parameters, refining agents and electrolyte described above. The foil was stain proofed by electrodepositing a chromate layer, followed by spray application of glycidoxy silane on the matte surface of the foil. FIG. 7 is a photomicrograph (1000 x), taken at an incident angle of 45°, showing the matte surface of the resulting foil. The resulting foil was then laminated to an epoxy/glass fiber prepreg, and the peel strength was measured and found to be 11 lbs./in.

Figure 8:
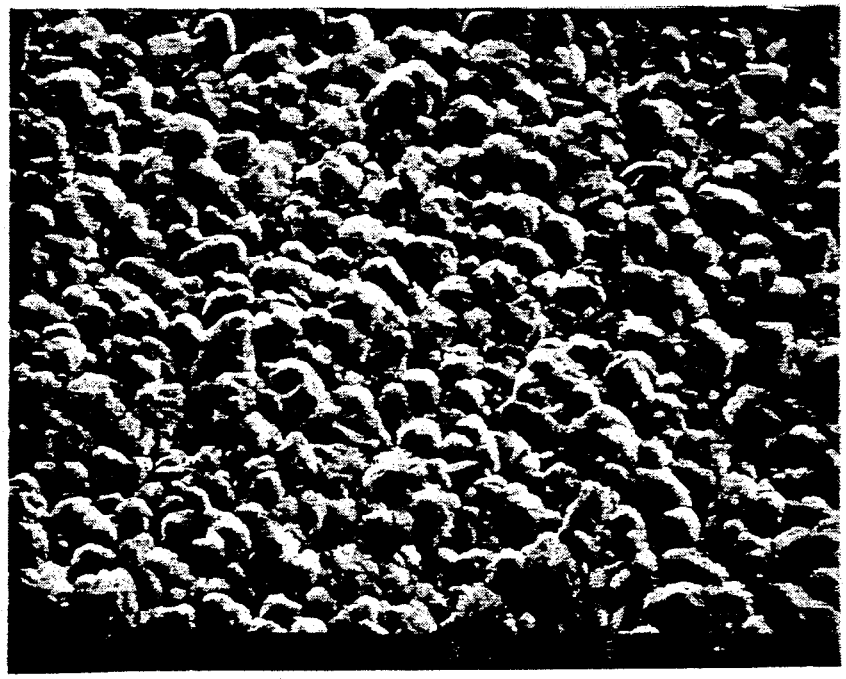
Figure 9:
FIG. 9 is a photomicrograph of the matte surface of copper foil which has been subjected to conventional treatment.

FIG. 8 illustrates the matte surface of foil made as described above, but using the main anodes only, with the secondary anode current off. After lamination to an epoxy/glass fiber prepreg, the peel strength was measured to be 4 lbs./in.

From a comparison of FIGS. 7 and 8, it may be seen that the foil of FIG. 8 has a matte (bonding) surface composed of micro-peaks and valleys, while the foil of FIG. 7 has a matte surface composed of spherical microprojections deposited on micro-peaks and valleys similar to those of FIG. 8. Further, the total bonding surface of the foil of the present invention is enlarged which, during lamination, allows the molten epoxy resin to flow into the thus-formed micro-cavities so that a higher peel strength is achieved.

Additional advantages and modifications of the invention described above will readily occur to those skilled in the art. Therefore, the invention in its broader aspects is not limited to the specific details, representative devices, and illustrative examples shown and described. Accordingly, departures may be made from such details without departing from the spirit o scope of the inventive concept as defined by the appended claims and their equivalents.

What is claimed is:

1. An electrolytic process for producing metal foil having a low-profile treated surface, which process comprises:
   (a) passing an electric current through an electrolyte solution containing a concentration of metal ions from a primary anode to a cathode spaced from said anode in a first electrodeposition zone at a first current density while circulating said electrolyte between said cathode and primary anode under turbulent flow conditions to electrodeposit on said cathode primary metal foil having a matte surface; and
   (b) passing an electric current through an electrolyte solution containing a concentration of metal ions from a secondary anode electrically insulated from said primary anode and spaced from said cathode to said cathode in a second electrodeposition zone at a second current density greater than that in said first zone while circulating the electrolyte in said second zone between said cathode and said secondary anode under laminar flow conditions to electrodeposit micronodules of said metal on said matte surface.

2. The process of claim 1, wherein said electrolyte in each of said first and said second zones contains a grain refining agent.

3. The process of claim 1, wherein said first current density is in the range of from about 20 to 100 A/DCM$^2$ and said second current density in the range of from about 100 to 300 /DCM$^2$.

4. The process of claim 1, wherein said electrolyte in said first zone is circulated between said cathode and said primary anode at a velocity of at least about 0.8 m/sec and said electrolyte in said second zone is circulated between said cathode and said secondary anode at a velocity of about 0.1 m/sec or less.

5. The process of claim 2, wherein said grain refining agent comprises a mixture of at least one gelatin and a cellulose ether.

6. The process of claim 5, wherein said electrolyte contains a mixture of gelatins having different molecular weights and a hydroxyalkyl cellulose.

7. The process of claim 2, wherein
   (a) said cathode is a rotating drum cathode at least partially immersed in said electrolyte;
   (b) said electrolyte comprises a copper sulfate-sulfuric acid solution having a copper concentration of from about 30 to 100 g/l, a sulfuric acid concentration of from about 40 to 150 g/l, contains a gelatin/cellulose ether grain refining agent, and is maintained at a temperature of from about 100° F. to about 180° F.;
   (c) said electrolyte is circulated in said first zone between said cathode and said primary anode at a velocity of at least 0.8 m/sec;

(d) said electrolyte is circulated in said second zone between said cathode and said secondary anode at a velocity of about 0.1 m/sec or less;
(e) said first current density is from about 20 to about 100 A/DCM$^2$; and
(f) and said second current density is at least about 100 A/DCM$^2$ but not greater than the limiting current density.

8. A copper foil produced by the process of claim 1.

9. A copper foil produced by the process of claim 7.

10. Apparatus for the electrolytic production of a metal foil, which apparatus comprises:
(a) a rotatable drum cathode having a leading portion and a trailing portion, said apparatus further comprising;
  (1) a first electrodeposition zone comprising:
    (b) at least one primary anode spaced from said leading portion of said cathode to form a first gap therebetween;
    (c) means for circulating electrolyte in said first gap under turbulent flow conditions; and
    d) means for passing electric current from said primary anode through electrolyte in said first zone to said leading portion of said cathode at a first current density; and
  (2) a second electrodeposition zone comprising:
    (e) a secondary anode electrically insulated from said primary anode and spaced from said trailing portion of said cathode to form a second gap therebetween;
    (f) means for introducing electrolyte into said second gap;
    (g) means for circulating electrolyte in said second gap under laminar flow conditions;
    (h) means for passing an electric current from said secondary anode through electrolyte in said second zone to said trailing portion of said cathode at a second current density greater than said first current density; and
    (i) means for withdrawing electrolyte from said first gap, said means for withdrawing electrolyte being positioned between said primary and secondary anodes adjacent a terminal portion of said primary anode and said means for introducing electrolyte being positioned between an initial portion of said secondary anode and said means for withdrawing electrolyte.

11. The apparatus of claim 10, further including a baffle positioned between said means for withdrawing electrolyte and said means for introducing electrolyte for directing electrolyte circulated in said first gap into said means for withdrawing electrolyte.

12. Apparatus for the electrolytic production of a metal foil comprising:
(a) a rotatable drum cathode having a leading portion and a trailing portion;
(b) a primary anode spaced from and opposite said leading portion of said cathode and having a terminal end portion;
(c) a secondary anode adjacent said terminal end portion and spaced from and opposite said trailing portion;
(d) means for withdrawing electrolyte from the space between said primary anode and said leading portion and positioned adjacent said terminal end portion;
(e) means for introducing electrolyte into the space between said secondary anode and said trailing portion adjacent said secondary anode; and
(f) a baffle positioned between said means for withdrawing electrolyte and said means for introducing electrolyte and extending toward said cathode.

* * * * *